(12) United States Patent
Critchley et al.

(10) Patent No.: US 10,582,634 B2
(45) Date of Patent: Mar. 3, 2020

(54) CABLING A SET OF ENCLOSURES

(71) Applicant: International Business Machines Corporation, Armonk, NY (US)

(72) Inventors: Daniel S. Critchley, Winchester (GB); Gordon D. Hutchison, Eastleigh (GB); Gareth P. Jones, Chandlers Ford (GB); Jonathan W. L. Short, Eastleigh (GB)

(73) Assignee: International Business Machines Corporation, Armonk, NY (US)

(*) Notice: Subject to any disclaimer, the term of this patent is extended or adjusted under 35 U.S.C. 154(b) by 597 days.

(21) Appl. No.: 15/187,066

(22) Filed: Jun. 20, 2016

(65) Prior Publication Data
US 2017/0367209 A1 Dec. 21, 2017

(51) Int. Cl.
*H01R 43/00* (2006.01)
*H05K 7/14* (2006.01)

(52) U.S. Cl.
CPC ......... *H05K 7/1491* (2013.01); *H05K 7/1492* (2013.01)

(58) Field of Classification Search
CPC .......................... H05K 7/1492; H05K 7/1491
See application file for complete search history.

(56) References Cited

U.S. PATENT DOCUMENTS

| | | | |
|---|---|---|---|
| 7,251,701 B2 * | 7/2007 | Chikusa | G06F 3/0613 710/74 |
| 7,519,854 B2 | 4/2009 | Lucas et al. | |
| 7,539,799 B2 | 5/2009 | Ashmore et al. | |
| 7,809,983 B2 * | 10/2010 | Suzuki | G06F 11/1443 714/14 |
| 7,836,351 B2 | 11/2010 | Maharana et al. | |
| 7,890,794 B1 | 2/2011 | Gasser | |
| 8,037,362 B2 * | 10/2011 | Suzuki | G06F 11/1443 714/14 |
| 8,077,605 B2 | 12/2011 | McCarty et al. | |

(Continued)

FOREIGN PATENT DOCUMENTS

WO WO2008/045457 A2 4/2008

OTHER PUBLICATIONS

"Dell Storage Center SCv2080 Storage System Deployment Guide", Dell, Inc., Revision A01, http://www.dell.com/support/manuals/br/en/brdhs1/storage-sc2080/SCv2080DG-v2/SAS-Redundancy?guid=GUID-6EE6A2DF-7683-4FE9-A22A-1324A93FDF4D&lang=en-us, Aug. 2015, 114 pages.

(Continued)

*Primary Examiner* — Paul D Kim
(74) *Attorney, Agent, or Firm* — Francis Lammes; Stephen J. Walder, Jr.; Robert M. Sullivan

(57) ABSTRACT

Mechanisms are provided for cabling a set of enclosures. Using a set of cables that comprises eight physical layers (PHYs), the set of enclosures are coupled together such that: for a first enclosure and each intermediate enclosure in the set of enclosures, at least four PHYs of the eight PHYs terminate within a Serial Attached Small Computer System Interface (SCSI) (SAS) expander of the first enclosure and a SAS expander of each intermediate enclosure white passing through a remaining four PHYs of the eight PHYs without connecting to the respective SAS expander; and, for a last enclosure in the set of enclosures, all of the eight PHYs terminate in the SAS expander of the last enclosure.

9 Claims, 8 Drawing Sheets

(56) References Cited

U.S. PATENT DOCUMENTS

| | | | |
|---|---|---|---|
| 8,312,325 B2* | 11/2012 | Suzuki | G06F 11/1443 714/14 |
| 8,402,196 B2* | 3/2013 | Davis | G06F 13/00 710/300 |
| 8,631,282 B2* | 1/2014 | Kurihara | G06F 11/2005 714/43 |
| 9,037,925 B2* | 5/2015 | Myrah | G06F 11/0727 714/47.2 |
| 2007/0294572 A1 | 12/2007 | Kalwitz et al. | |
| 2009/0063901 A1* | 3/2009 | Suzuki | G06F 11/1443 714/25 |
| 2011/0219158 A1* | 9/2011 | Davis | G06F 13/00 710/300 |
| 2012/0137166 A1* | 5/2012 | Kurihara | G06F 11/2005 714/5.1 |
| 2015/0032928 A1 | 1/2015 | Andrews et al. | |
| 2016/0350239 A1 | 12/2016 | Colline | |

OTHER PUBLICATIONS

"Serial-attached SCSI cable planning", IBM Corporation, https://www.ibm.com/support/knowledgecenter/P8DEA/p8had/p8had_sascabling.htm, Feb. 19, 2016, 35 pages.

"SUPERO SC933 Chassis Series, User's Manual", Super Micro Computers, Inc., Manual Revision 2.0b,http://www.manualslib.com/manual/532449/Supermicro-Supero-Sc933-Series.html?page=42, Dec. 12, 2011, p. A-2.

* cited by examiner

CABLING A SET OF ENCLOSURES

BACKGROUND

The present application relates generally to an improved data processing apparatus and method for cabling multiple enclosures using top-down/bottom-up cabling.

Typically, a storage subsystem comprises multiple enclosures coupled using interconnecting cables for communication capabilities. A typical cabling scheme may involve a controller which couples to a first enclosure, the first enclosure coupling to a second enclosure, the second enclosure coupling to a third enclosure, and so forth. FIG. 1 illustrates one example where enclosures 102 within system 100 have an "A" side and a "B side coupled to controller 104 using a dual-chain scheme. As is illustrated, enclosures 102 above controller 104 are coupled by cables 106 in a different chain from enclosures 102 below controller 104 that are coupled by cables 108. However, for those enclosures 102 coupled by cables 106, if any one enclosure 102 loses power, then the enclosures 102 above and including the enclosure 102 that loses power, become inaccessible. Similarly, for those enclosures 102 coupled by cables 108, if any one enclosure 102 loses power, then the enclosures 102 below and including the enclosure 102 that loses power, become inaccessible.

A common scheme for increasing reliability is to wire one side of an enclosure "top down" and the other side of the enclosure "bottom up." For example, in FIG. 2, the "A" sides of enclosures 202 in system 200 are coupled by cables 206 to controller 204 in a "bottom-up" scheme and the "B" sides of enclosures 202 are coupled to controller 204 by cables 208 in a "top-down" scheme. The advantage here is that if a whole enclosure 202 loses power, then the left chain of enclosures 202 coupled by cables 208 may still access data above the failure, while the right chain of enclosures coupled by cables 206 may still access data below the failure. If enclosures 202 were coupled in a "top-down" scheme on both chains, then access to the enclosures 202 would only be preserved above the failure.

An enhancement of the cabling scheme of FIG. 2 uses an additional cable to make both sides of the chain "top down" and "bottom up." For example, in FIG. 3, the "A" sides of enclosures 302 in system 300 are coupled by cables 306 to controller 304 in a "bottom-up" scheme and the "B" sides of enclosures 302 are coupled to controller 304 by cables 308 in a "top-down" scheme. However, an additional cable 310 is added to the "A" side and an additional cable 312 is added to the "B" side to make both sides of the chain "top down" and "bottom up."

This cabling scheme gives improved reliability but also provides significant performance improvement. Normally, the further an enclosure is from the controller, the lower the average utilization of each link between the enclosures. For example, using the four enclosures depicted in FIG. 3, the connection from controller 304 to the 1st enclosure would be 100% utilized and, on average the link between the 1st and 2nd enclosure would be 75% utilized, the link between the 2nd and 3rd enclosure would be 50% utilized, and the link between the 3rd and 4th enclosure would be 25% utilized. By having controller 304 coupled to both ends and routing requests evenly, "wasted" bandwidth may be reclaimed.

However, feedback from field support teams indicates wiring schemes such as those depicted in FIG. 3 are more prone to being installed incorrectly, especially during the installation of additional enclosures, which requires moving cables as opposed to simply appending to the end of the chain. In the worst case, cabling errors cause invalid network topologies which turn into concurrent service action and further outages for the customer, which increases support costs and decreases customer satisfaction.

SUMMARY

This Summary is provided to introduce a selection of concepts in a simplified form that are further described herein in the Detailed Description. This Summary is not intended to identify key factors or essential features of the claimed subject matter, nor is it intended to be used to limit the scope of the claimed subject matter.

In one illustrative embodiment, a method, in a data processing system, is provided for cabling a set of enclosures. Using a set of cables that comprises eight physical layers (PHYs), the illustrative embodiment couples the set of enclosures together such that: for a first enclosure and each intermediate enclosure in the set of enclosures, at least four PHYs of the eight PHYs terminate within a Serial Attached Small Computer System Interface (SCSI) (SAS) expander of the first enclosure and a SAS expander of each intermediate enclosure while passing through a remaining four PHYs of the eight PHYs without connecting to the respective SAS expander; and, for a last enclosure in the set of enclosures, all of the eight PHYs terminate in the SAS expander of the last enclosure.

In another illustrative embodiment, a method, in a data processing system, is provided for cabling two separate sets of enclosures. Using a set of cables that each comprise eight physical layers (PHYs): for a first set of enclosures in the two separate sets of enclosures, the illustrative embodiment couples the set of enclosures together such that, for each enclosure in the first set of enclosures, at least four PHYs of the eight PHYs terminate within a Serial Attached Small Computer System Interface (SCSI) (SAS) expander of each enclosure in the first set of enclosures while a remaining four PHYs of the eight PHYs pass through without connecting to the respective SAS expander of the first set of enclosures; and, for a second set of enclosures in the two separate sets of enclosures, the illustrative embodiment couples the set of enclosures together such that, for each enclosure in the second set of enclosures, the remaining four PHYs of the eight PHYs terminate within SAS expander of each enclosure in the second set of enclosures while the at least four PHYs of the eight PHYs pass through without connecting to the respective SAS expander of the second set of enclosures.

These and other features and advantages of the present invention will be described in, or will become apparent to those of ordinary skill in the art in view of, the following detailed description of the example embodiments of the present invention.

BRIEF DESCRIPTION OF THE DRAWINGS

The invention, as well as a preferred mode of use and further objectives and advantages thereof, will best be understood by reference to the following detailed description of illustrative embodiments when read in conjunction with the accompanying drawings, wherein.

DETAILED DESCRIPTION

Figure 1:
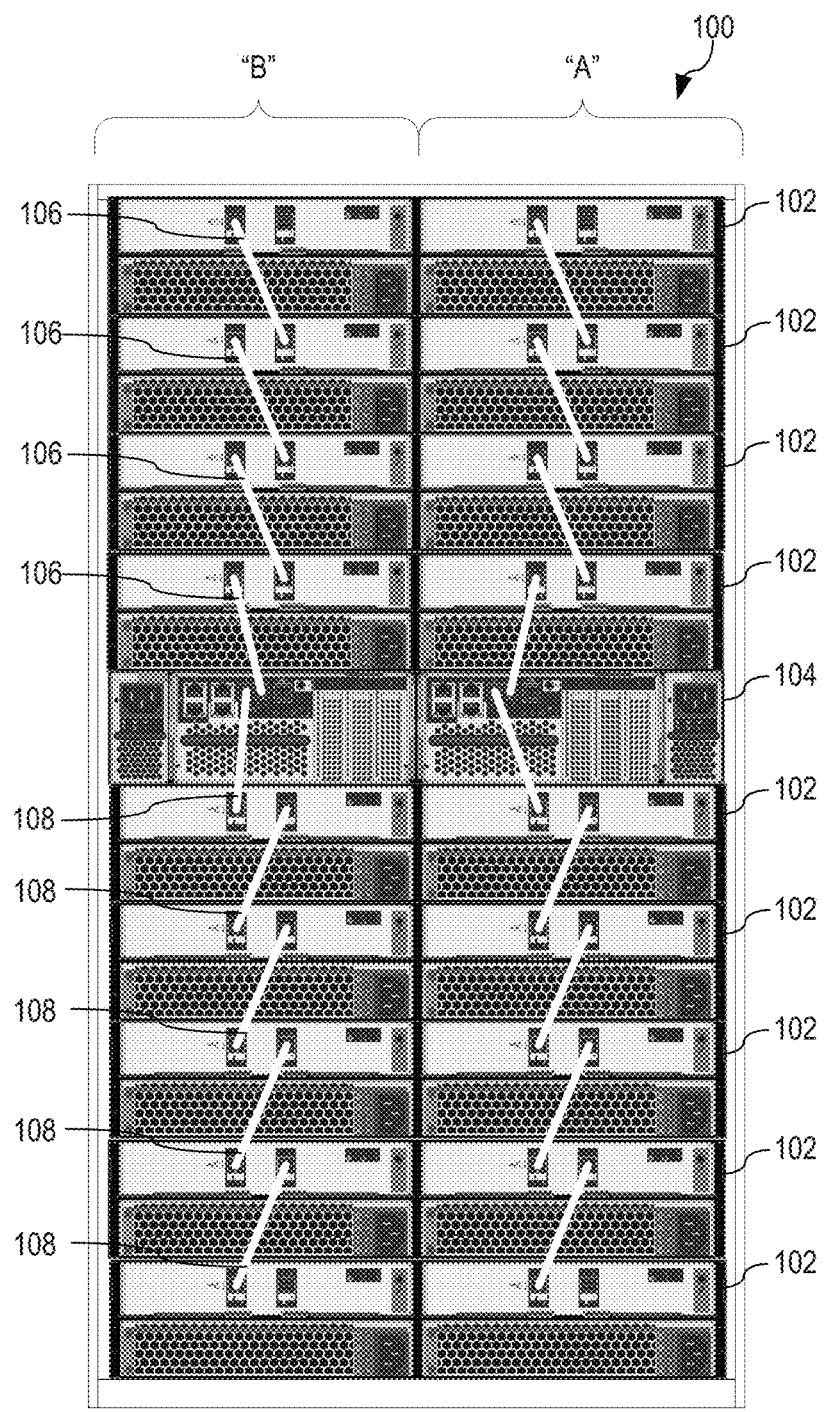
FIG. 1 illustrates a set of enclosures coupled to a controller in a dual chain scheme.
Figure 2:
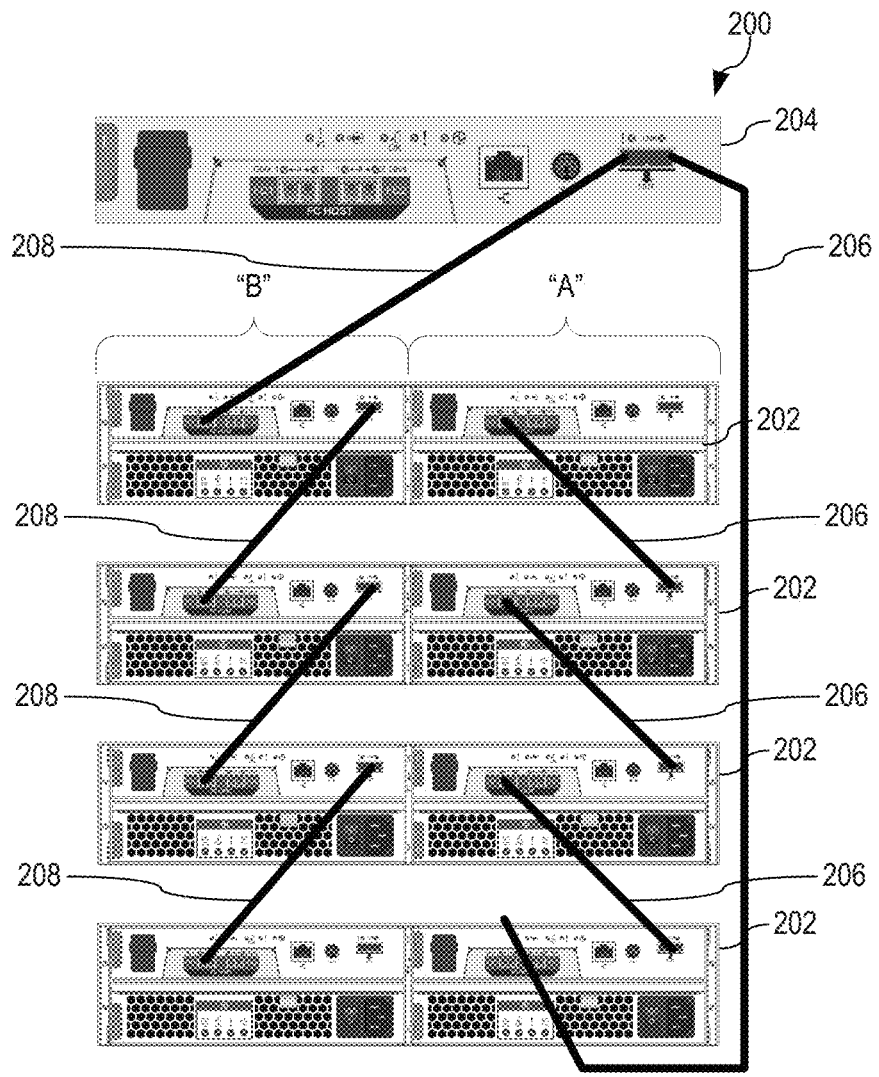
FIG. 2 illustrates a set of enclosures where an "A" side is coupled to a controller in a "bottom-up" scheme and a "B" side is coupled to the controller in a "top-down" scheme.
Figure 3:
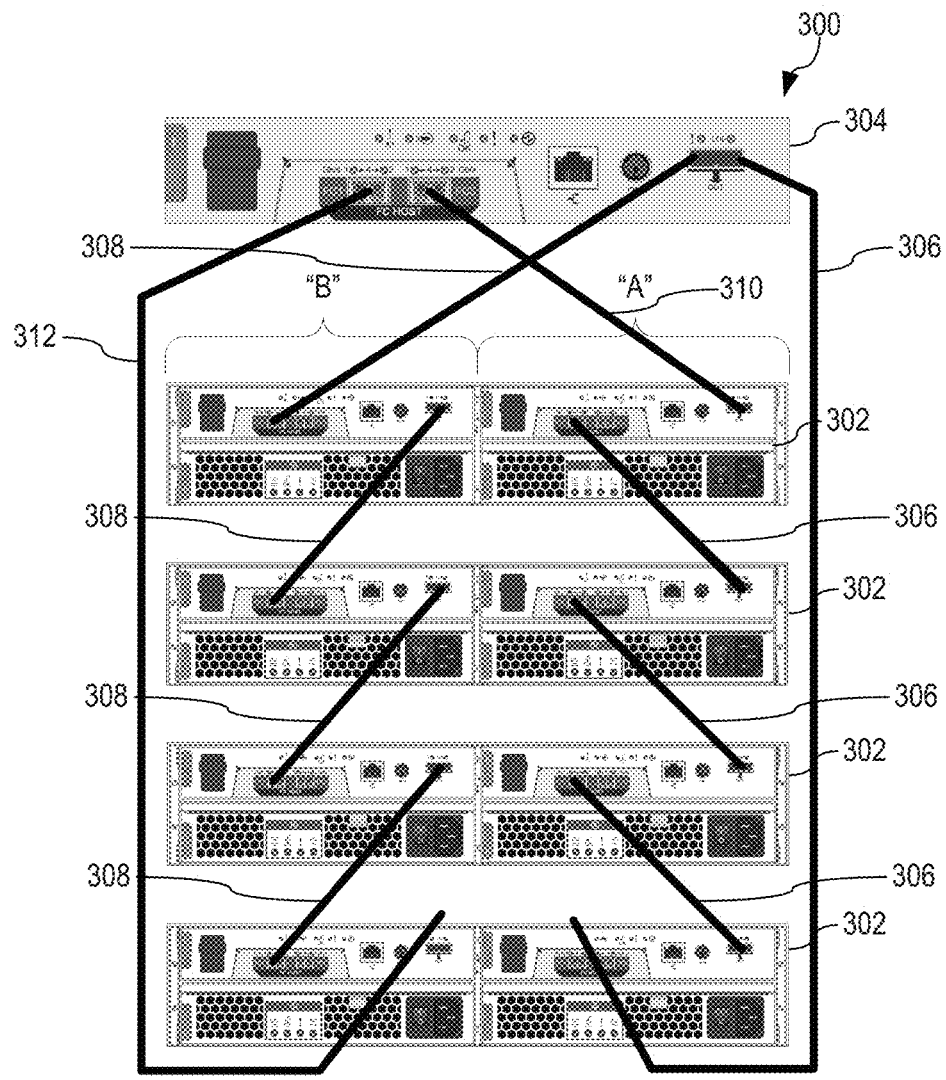
FIG. 3 illustrates a set of enclosures where the "A" side and the "B" side are coupled to the controller in both a "top-down" and "bottom-up" scheme.

The illustrative embodiments provide a cabling scheme for cabling multiple enclosures using top-down/bottom-up cabling. In a Serial Attached Small Computer System Interface (SCSI) (SAS) network, each cable coupling the enclosures together may have multiple channels or physical layers (PHYs) that run through the cable. Typically, four PHYs are used in each cable. However, high-density (HD) cables have eight PHYs. In some systems, HD cables are utilized but four of the PHYs are wasted.

While utilizing all eight PHYs on the cable throughout, the system in which the HD cables are used may seem to be an obvious solution, utilizing all eight PHYs does not provide the reliability improvements of being connected at both ends. Furthermore, when all eight PHYs are used, the enclosure to which the HD cable is connected requires a larger SAS expander in order to handle upstream connections (from a previous enclosure) and downstream connection (to a next enclosure). That is, if a standard cable with only four PHYs is used, then, for a 24 storage drive enclosure, a 32-PHY or greater SAS expander is required. When an HD cable is used with eight PHYs, a 40-PHY SAS expander is required. Given current SAS expanders that come in 36-PHY and 48-PHY variants, utilizing all eight PHYs of an HD cable requires using larger, and hence more expensive, SAS expanders.

Thus, the illustrative embodiments provide an alternative to obvious solutions by providing improved performance and reliability while still using the smaller SAS expander. That is, the illustrative embodiments make use of the four "wasted" PHYs, hereinafter referred to as spare PHYs, of an HD cable while utilizing the smaller SAS expander to create an alternative route that provides for cabling multiple enclosures using top-down/bottom-up cabling scheme.

Before beginning the discussion of the various aspects of the illustrative embodiments, it should first be appreciated that the present description and claims may make use of the terms "a," "at least one of," and "one or more of" with regard to particular features and elements of the illustrative embodiments. It should be appreciated that these terms and phrases are intended to state that there is at least one of the particular feature or element present in the particular illustrative embodiment, but that more than one can also be present. That is, these terms/phrases are not intended to limit the description or claims to a single feature/element being present or require that a plurality of such features/elements be present. To the contrary, these terms/phrases only require at least a single feature/element with the possibility of a plurality of such features/elements being within the scope of the description and claims.

In addition, it should be appreciated that the following description uses a plurality of various examples for various elements of the illustrative embodiments to further illustrate example implementations of the illustrative embodiments and to aid in the understanding of the mechanisms of the illustrative embodiments. These examples intended to be non-limiting and are not exhaustive of the various possibilities for implementing the mechanisms of the illustrative embodiments. It will be apparent to those of ordinary skill in the art in view of the present description that there are many other alternative implementations for these various elements that may be utilized in addition to, or in replacement of, the examples provided herein without departing from the spirit and scope of the present invention.

Figure 4:
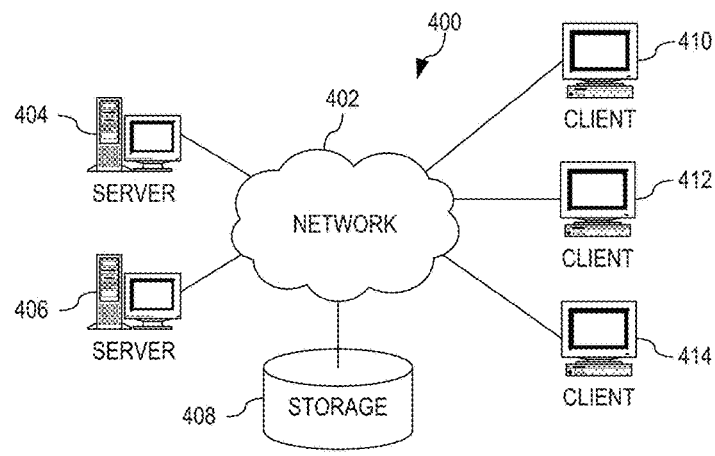
FIG. 4 depicts a pictorial representation of an example distributed data processing system in which aspects of the illustrative embodiments may be implemented.
Figure 5:
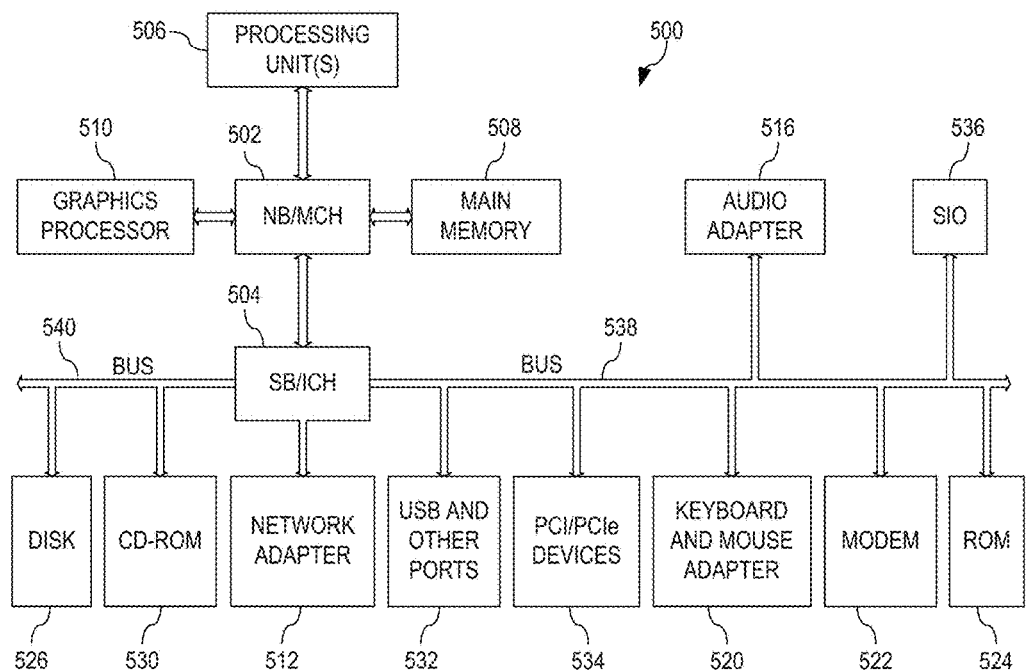
FIG. 5 is a block diagram of just one example data processing system in which aspects of the illustrative embodiments may be implemented.

Thus, the illustrative embodiments may be utilized in many different types of data processing environments. In order to provide a context for the description of the specific elements and functionality of the illustrative embodiments, FIGS. 4 and 5 are provided hereafter as example environments in which aspects of the illustrative embodiments may be implemented. It should be appreciated that FIGS. 4 and 5 are only examples and are not intended to assert or imply any limitation with regard to the environments in which aspects or embodiments of the present invention may be implemented. Many modifications to the depicted environments may be made without departing from the spirit and scope of the present invention.

FIG. 4 depicts a pictorial representation of an example distributed data processing system in which aspects of the illustrative embodiments may be implemented. Distributed data processing system 400 may include a network of computers in which aspects of the illustrative embodiments may be implemented. The distributed data processing system 400 contains at least one network 402, which is the medium used to provide communication links between various devices and computers connected together within distributed data processing system 400. The network 402 may include connections, such as wire, wireless communication links, or fiber optic cables.

In the depicted example, server 404 and server 406 are connected to network 402 along with storage unit 408. In addition, clients 410, 412, and 414 are also connected to network 402. These clients 410, 412, and 414 may be, for example, personal computers, network computers, or the like. In the depicted example, server 404 provides data, such as boot files, operating system images, and applications to the clients 410, 412, and 414. Clients 410, 412, and 414 are clients to server 404 in the depicted example. Distributed data processing system 400 may include additional servers, clients, and other devices not shown.

In the depicted example, distributed data processing system 400 is the Internet with network 402 representing a worldwide collection of networks and gateways that use the Transmission Control Protocol/Internet. Protocol (TCP/IP) suite of protocols to communicate with one another. At the heart of the Internet is a backbone of high-speed data communication lines between major nodes or host computers, consisting of thousands of commercial, governmental, educational and other computer systems that route data and messages. Of course, the distributed data processing system 400 may also be implemented to include a number of different types of networks, such as for example, an intranet, a local area network (LAN), a wide area network (WAN), or the like. As stated above, FIG. 4 is intended as an example, not as an architectural limitation for different embodiments of the present invention, and therefore, the particular elements shown in FIG. 4 should not be considered limiting with regard to the environments in which the illustrative embodiments of the present invention may be implemented.

As shown in FIG. 4, one or more of the computing devices, e.g., server 404, may be specifically configured to implement a cabling scheme for cabling multiple enclosures using top-down/bottom-up cabling. The configuring of the computing device may comprise the providing of application specific hardware, firmware, or the like to facilitate the performance of the operations and generation of the outputs described herein with regard to the illustrative embodiments. The configuring of the computing device may also, or alternatively, comprise the providing of software applications stored in one or more storage devices and loaded into memory of a computing device, such as server 404, for causing one or more hardware processors of the computing device to execute the software applications that configure the processors to perform the operations and generate the outputs described herein with regard to the illustrative embodiments. Moreover, any combination of application specific hardware, firmware, software applications executed on hardware, or the like, may be used without departing from the spirit and scope of the illustrative embodiments.

It should be appreciated that once the computing device is configured in one of these ways, the computing device becomes a specialized computing device specifically configured to implement the mechanisms of the illustrative embodiments and is not a general-purpose computing device. Moreover, as described hereafter, the implementation of the mechanisms of the illustrative embodiments improves the functionality of the computing device and provides a useful and concrete result that facilitates cabling multiple enclosures using top-down/bottom-up cabling.

As noted above, the mechanisms of the illustrative embodiments utilize specifically configured computing devices, or data processing systems, to perform the operations for cabling multiple enclosures using top-down/bottom-up cabling. These computing devices, or data processing systems, may comprise various hardware elements that are specifically configured, either through hardware configuration, software configuration, or a combination of hardware and software configuration, to implement one or more of the systems/subsystems described herein. FIG. 5 is a block diagram of just one example data processing system in which aspects of the illustrative embodiments may be implemented. Data processing system 500 is an example of a computer, such as server 404 in FIG. 4, in which computer usable code or instructions implementing the processes and aspects of the illustrative embodiments of the present invention may be located and/or executed to achieve the operation, output, and external effects of the illustrative embodiments as described herein.

In the depicted example, data processing system 500 employs a hub architecture including north bridge and memory controller hub (NB/MCH) 502 and south bridge and input/output (I/O) controller hub (SB/ICH) 504. Processing unit 506, main memory 508, and graphics processor 510 are connected to NB/MCH 502. Graphics processor 510 may be connected to NB/MCH 502 through an accelerated graphics port (AGP).

In the depicted example, local area network (LAN) adapter 512 connects to SB/ICH 504. Audio adapter 516, keyboard and mouse adapter 520, modem 522, read only memory (ROM) 524, hard disk drive (HDD) 526, CD-ROM drive 530, universal serial bus (USB) ports and other communication ports 532, and PCI/PCIe devices 534 connect to SB/ICH 504 through bus 538 and bus 540. PCI/PCIe devices may include, for example, Ethernet adapters, add-in cards, and PC cards for notebook computers. PCI uses a card bus controller, while PCIe does not. ROM 524 may be, for example, a flash basic input/output system (BIOS).

HDD 526 and CD-ROM drive 530 connect to SB/ICH 504 through bus 540. HDD 526 and CD-ROM drive 530 may use, for example, an integrated drive electronics (IDE) or serial advanced technology attachment (SATA) interface. Super I/O (SIO) device 536 may be connected to SB/ICH 504.

An operating system runs on processing unit 506. The operating system coordinates and provides control of various components within the data processing system 500 in FIG. 5. As a client, the operating system may be a commercially available operating system such as Microsoft® Windows 7®. An object-oriented programming system, such as the Java™ programming system, may run in conjunction with the operating system and provides calls to the operating system from Java™ programs or applications executing on data processing system 500.

As a server, data processing system 500 may be, for example, an IBM eServer™ System P® computer system, Power™ processor based computer system, or the like, running the Advanced Interactive Executive (AIX®) operating system or the LINUX® operating system. Data processing system 500 may be a symmetric multiprocessor (SMP) system including a plurality of processors in processing unit 506. Alternatively, a single processor system may be employed.

Instructions for the operating system, the object-oriented programming system, and applications or programs are located on storage devices, such as HDD 526, and may be loaded into main memory 508 for execution by processing unit 506. The processes for illustrative embodiments of the present invention may be performed by processing unit 506 using computer usable program code, which may be located in a memory such as, for example, main memory 508, ROM 524, or in one or more peripheral devices 526 and 530, for example.

A bus system, such as bus 538 or bus 540 as shown in FIG. 5, may be comprised of one or more buses. Of course, the bus system may be implemented using any type of communication fabric or architecture that provides for a transfer of data between different components or devices attached to the fabric or architecture. A communication unit, such as modem 522 or network adapter 512 of FIG. 5, may include one or more devices used to transmit and receive data. A memory may be, for example, main memory 508, ROM 524, or a cache such as found in NB/MCH 502 in FIG. 5.

As mentioned above, in some illustrative embodiments the mechanisms of the illustrative embodiments may be implemented as application specific hardware, firmware, or the like, application software stored in a storage device, such as HDD 526 and loaded into memory, such as main memory 508, for executed by one or more hardware processors, such as processing unit 506, or the like. As such, the computing device shown in FIG. 5 becomes specifically configured to implement the mechanisms of the illustrative embodiments and specifically configured to perform the operations and generate the outputs described hereafter with regard to the cabling scheme for cabling multiple enclosures using top-down/bottom-up cabling.

Those of ordinary skill in the art will appreciate that the hardware in FIGS. 4 and 5 may vary depending on the implementation. Other internal hardware or peripheral devices, such as flash memory, equivalent non-volatile memory, or optical disk drives and the like, may be used in addition to or in place of the hardware depicted in FIGS. 4 and 5. Also, the processes of the illustrative embodiments may be applied to a multiprocessor data processing system, other than the SMP system mentioned previously, without departing from the spirit and scope of the present invention.

Moreover, the data processing system 500 may take the form of any of a number of different data processing systems including client computing devices, server computing devices, a tablet computer, laptop computer, telephone or other communication device, a personal digital assistant (PDA), or the like. In some illustrative examples, data processing system 500 may be a portable computing device that is configured with flash memory to provide non-volatile memory for storing operating system files and/or user-generated data, for example. Essentially, data processing system 500 may be any known or later developed data processing system without architectural limitation.

Figure 6:
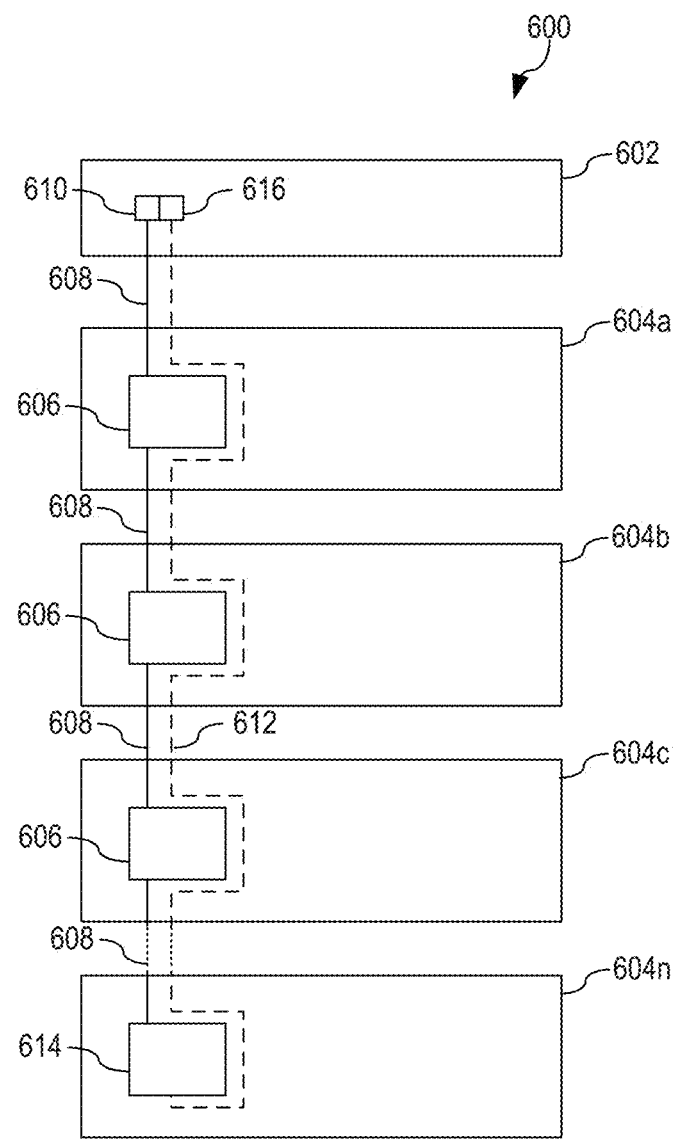
FIG. 6 depicts one example of multiple enclosures being cabled together utilizing spare PHYs of an HID cable in accordance with an illustrative embodiment.

As stated above, in order to cable multiple enclosures, which are each data processing systems such as data processing system 500 of FIG. 5, using top-down/bottom-up cabling, the illustrative embodiments utilize the spare PHYs of an HD cable coupling the enclosures together and a smaller less expensive SAS expander. FIG. 6 depicts one example of multiple enclosures being cabled together utilizing spare PHYs of an HD cable in accordance with an illustrative embodiment. Data processing system 600 comprises controller 602 and enclosures 604a-604n. In data processing system 600, controller 602 is coupled to enclosure 604a using a single HD cable comprising eight PHYs, enclosure 604a is coupled to enclosure 604b using a single ED cable comprising eight PHYs, enclosure 604b is coupled to enclosure 604c using a single HD cable comprising eight PHYs, and so on until the next-to-last enclosure is coupled to enclosure 604n using a single HD cable comprising eight PHYs. For each intermediate enclosure between controller 602 and enclosure 604n, SAS expander 606 within the intermediate enclosures, enclosures 604a-604c in the depicted example, are passively configured to pass the four spare PHYs straight through the intermediate enclosure and back out again without physically touching SAS expander 606 as shown by connection 612. Thus, as shown by connections 608, four PHYs couple port 610 on controller 602 to SAS expander 606 on enclosure 604a, four PHYs couple SAS expander 606 on enclosure 604a to SAS expander 606 on enclosure 604b, four PHYs couple SAS expander 606 on enclosure 604b to SAS expander 606 on enclosure 604c, and so on until four PHYs couple SAS expander 606 on the next-to-last enclosure to SAS expander 614 on enclosure 604n. Once the enclosure 604n is reached, SAS expander 614 in enclosure 604n is actively configured to receive not only the four PHYs from connections 608 but also the four spare PHYs from connection 612, which are coupled to port 616 on controller 602.

Thus, since the pass-through PHYs of connection 612 are implemented as passive connections, then the cabling scheme of FIG. 6 is resilient to the loss of power of a single enclosure. For example, if enclosure 604b were to fail for any reason, then access to enclosures 604c-604n is still available via connection 612, while access to enclosure 604a is available via connection 608. Therefore, the cabling scheme of FIG. 6 provides eight PHYs worth of bandwidth to controller 602 by using the spare bandwidth of connection 612 that is normally lost when only four PHYs of connections 608 are utilized in prior implementations, while still using a smaller SAS expander.

Passing through connection 612 in intermediate enclosures 604a-604c while allowing connection 612 to terminate in last enclosure 604n may be achieved in a number of ways. In a first implementation, the four spare PHYs are switched as pass through or terminating based on presence/absence of a second HD cable. When a second cable is present, the hardware switching mechanism routes the four spare PHYs to the downstream port. When the second cable is absent, the hardware switching mechanism routes the four spare PHYs to the SAS expander. In a second implementation, a management application of controller 602 explores a topology of enclosures 604a-604n in order to discover a last enclosure in the cabling scheme. Once the last enclosure is determined, the management application sends commands to each switch of enclosure 604a-604n to set the switch to the appropriate position, i.e. pass through for enclosures 604a-604c and terminating for enclosure 604n. In a third implementation, rather than a switch being physically set with each enclosure, a cable connection point on the enclosure may be set by the insertion of the HD cable such that, when as second cable is present, a connection is made between the first cable and the second cable thereby routing the four spare PHYs to the downstream port, and, when the second cable is absent, the connection routes all the PHYs to the SAS expander 614.

Figure 7:
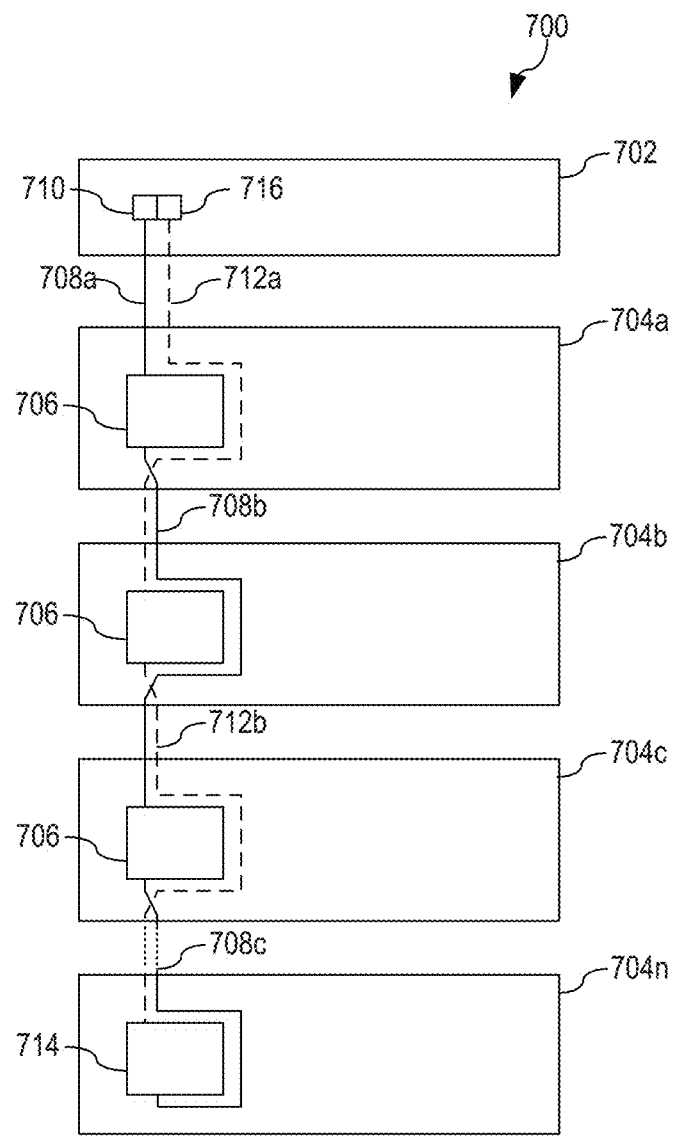
FIG. 7 depicts another example of multiple enclosures being cabled together utilizing spare PHYs of an HD cable with signal redrive in accordance with an illustrative embodiment.

In order to account for instances where the distance of connection 612 to the last enclosure is of a length that signal degradation may be incurred, FIG. 7 depicts another example of multiple enclosures being cabled together utilizing spare PHYs of an HD cable with signal redrive in accordance with an illustrative embodiment. Data processing system 700 comprises controller 702 and enclosures 704a-704n. In data processing system 700, controller 702 is coupled to enclosure 704a using a single HD cable comprising eight PHYs, enclosure 704a is coupled to enclosure 704b using a single HD cable comprising eight PHYs, enclosure 704b is coupled to enclosure 704c using a single HD cable comprising eight PHYs, and so on until the next-to-last enclosure is coupled to enclosure 704n using a single HD cable comprising eight PHYs.

In contradistinction to the cabling scheme of FIG. 6, the switching performed in FIG. 7 for every other of enclosures 704a-704n alternates between a direct connection to the SAS expander 706 and a pass through. Thus, connection 708a shows four PHYs coupling port 710 on controller 702 to SAS expander 706 on enclosure 704a and connection 712a passing four PHYs though enclosure 704a. However, connection 708b illustrates 4 PHYs being passed through enclosure 704b while connection 712a couples four PHYs from port 716 of controller 702 to SAS expander 706 on enclosure 704b. To continue, connection 708b shows four PHYs coupling SAS expander 706 on enclosure 704a to SAS expander 706 on enclosure 704c and connection 712b passing four PHYs though enclosure 704c. The passing through and terminating continues until last enclosure 704n is reached. Once the enclosure 704n is reached, SAS expander 714 in enclosure 704n is passively configured to receive not only the four PHYs from connection 712b but also the 4 PHYs from connection 708c.

Passing through/terminating connections 708a, 712a, 708b, and 712b in intermediate enclosures 704a-704c while allowing connection 712b and 708c to terminate in last enclosure 704n may be achieved in a number of ways. In a first implementation, the four spare PHYs are switched as pass through or terminating based on presence/absence of a second HD cable. When a second cable is present, the hardware switching mechanism routes the incoming four spare PHYs as the four primary PHYs to the downstream port and the incoming four primary PHYs as the four spare PHYs to the downstream port. When the second cable is absent, the hardware switching mechanism routes the four spare PHYs to the SAS expander. In a second implementation, a management application of controller 702 explores a topology of enclosures 704a-704n in order to discover a last enclosure in the cabling scheme. Once the last enclosure is determined, the management application sends commands to each switch of enclosure 704a-704n to set the switch to the appropriate position, i.e. pass through and alternate for enclosures 704a-704c and terminating for enclosure 704n. In a third implementation, rather than a switch being physically set with each enclosure, a cable connection point on the enclosure may be set by the insertion of the HD cable such that, when a second cable is present, an alternating connection is made between the first cable and the second cable thereby routing the four spare PHYs to the downstream port on the alternate PHYs, and, when the second cable is absent, the connection routes all the PHYs to the SAS expander 714.

Implementing the cabling scheme of FIG. 7 provides a resolution to signal degradation while also being resilient to the toss of power of a single enclosure. For example, if enclosure 704b were to fail for any reason, then access to enclosures 704c-704n are still available via connections 708b and 708c, while access to enclosure 704a is available via connection 708a. While the alternating cabling scheme of FIG. 7 presents SAS expanders 706 and 714 in a different order to controller 702, controller 702 easily accounts for the different order through management software. That is, using the cabling scheme of FIG. 6, controller 602 identifies enclosures 604a-604n in the order 1-2-3-4 on port 610 and 4-3-2-1 on port 616. Using the cabling scheme of FIG. 7, controller 702 identifies enclosures 704a-704n in the order 1-3-4-2 on port 710 and 2-4-3-1 on port 716.

Figure 8:
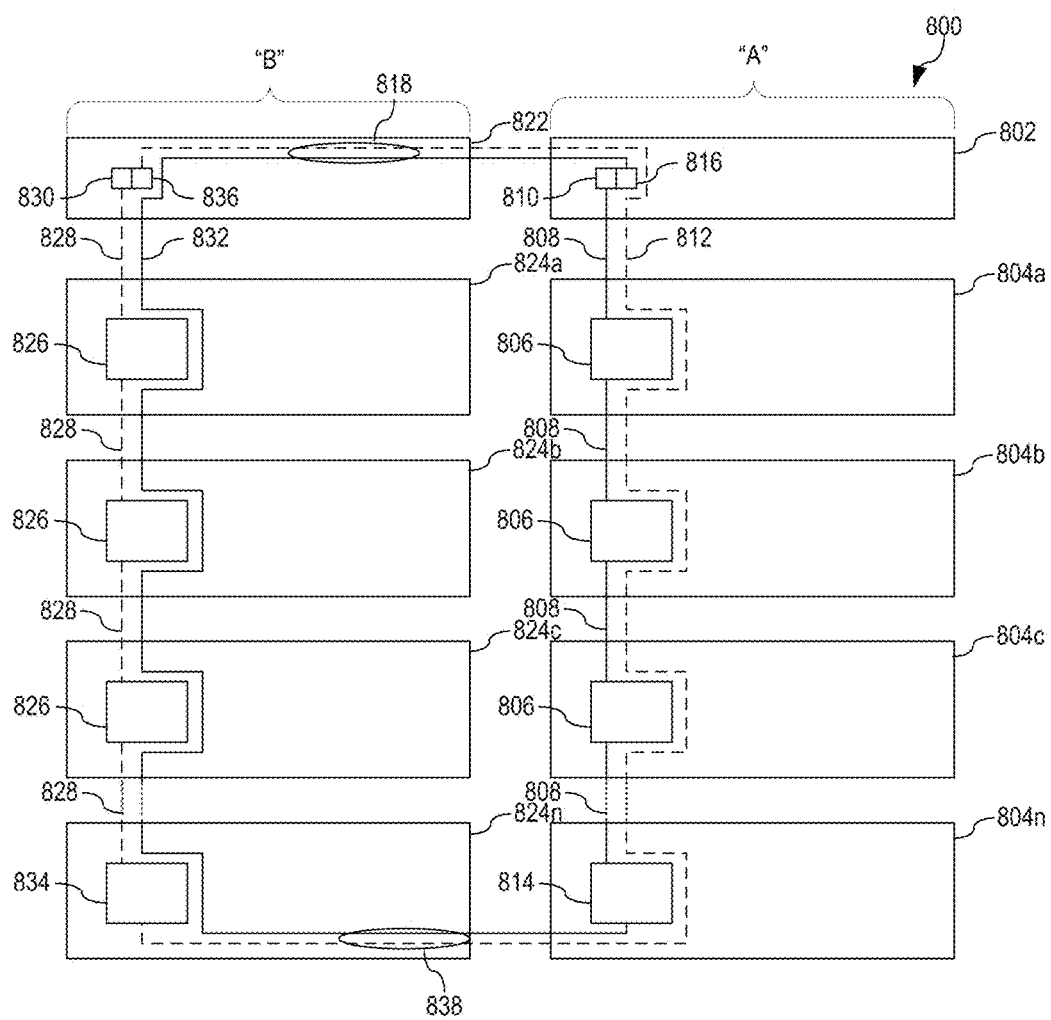
FIG. 8 depicts an example of two sets of multiple enclosures being cabled together utilizing spare PHYs of HD cables creating an alternative route in accordance with an illustrative embodiment.

While the cabling schemes depicted in FIGS. 6 and 7 provide for resiliency when an enclosure fails, in order to account for instances where a cable fails, FIG. 8 depicts an example of two sets of multiple enclosures being cabled together utilizing spare PHYs of HD cables creating an alternative route in accordance with an illustrative embodiment. Data processing system 800 comprises an "A" side controller 802 that controls enclosures 804a-804n and a "B" side controller 822 that controls enclosures 824a-824n. On the "A" side controller 802 is coupled to enclosure 804a using a single HD cable comprising eight PHYs, enclosure 804a is coupled to enclosure 804b using a single HD cable comprising eight PHYs, enclosure 804b is coupled to enclosure 804c using a single HD cable comprising eight PHYs, and so on until the next-to-last enclosure is coupled to enclosure 804n using a single HD cable comprising eight PHYs. For each intermediate enclosure between controller 802 and enclosure 804n, SAS expander 806 within the intermediate enclosures, enclosures 804a-804c in the depicted example, are passively configured to pass the four spare PHYs straight through the intermediate enclosure and back out again without physically touching SAS expander 806 as shown by connection 812. Thus, as shown by connections 808, four PHYs couple port 810 on controller 802 to SAS expander 806 on enclosure 804a, four PHYs couple SAS expander 806 on enclosure 804a to SAS expander 806 on enclosure 804b, four PHYs couple SAS expander 806 on enclosure 804b to SAS expander 806 on enclosure 804c, and so on until four PHYs couple SAS expander 806 on the next-to-last enclosure to SAS expander 814 on enclosure 804n.

Similarly, on the "B" side controller 822 is coupled to enclosure 824a using a single HD cable comprising eight PHYs, enclosure 824a is coupled to enclosure 824b using a single HD cable comprising eight PHYs, enclosure 824b is coupled to enclosure 824c using a single HD cable comprising eight PHYs, and so on until the next-to-last enclosure is coupled to enclosure 824n using a single HD cable comprising eight PHYs. For each intermediate enclosure between controller 822 and enclosure 824n, SAS expander 826 within the intermediate enclosures, enclosures 824a-824c in the depicted example, are passively configured to pass the four spare PHYs straight through the intermediate enclosure and back out again without physically touching SAS expander 826 as shown by connection 832. Thus, as shown by connections 828, four PHYs couple port 830 on controller 822 to SAS expander 826 on enclosure 824a, four PHYs couple SAS expander 826 on enclosure 824a to SAS expander 826 on enclosure 824b, four PHYs couple SAS expander 826 on enclosure 824b to SAS expander 826 on enclosure 824c, and so on until four PHYs couple SAS expander 826 on the next-to-last enclosure to SAS expander 834 on enclosure 824n.

However, in order to provide an alternate path for both the "A" side and the "B" side, HD cable 818 is provided that couples controller 802 to controller 822 and HD cable 838 is provided that couples enclosure 804n to enclosure 824n. With regard to HD cable 818, on the "A" side, a first four PHYs of HD cable 818 connect to port 816 and the second four PHYs are passed through controller 802 to controller 822. That is, the second four PHYS complete connection 812 to controller 822 such that, on the "B" side the second four PHYs of HD cable 818 connect to port 836. Further, on the "B" side, the first four PHYs that connect to port 816 in controller 802 are passed through completing connection 832.

With regard to HD cable 838 that coupled enclosure 804n to enclosure 824n, on the "A" side, the first four PHYs couple to SAS expander 814 in enclosure 804n and the second four PHYs couple connection 812 that passes through enclosure 804n to SAS expander 834 in enclosure 824n. On the "B" side, the first four PHYs are passed through enclosure 824n to complete connection 832 and the second four PHYs couple connection 812 that passes through enclosure 804n to SAS expander 834 in enclosure 824n.

In this cabling scheme, if any one cable fails, an alternative route to the enclosure may be initialized through the alternate route. In both cases, both controllers have full access to all SAS expanders and thus, all enclosures in data processing system 800. In this example, controller 802 has a top-down connection through connections 808 and a bottom-up connection through connection 832. Similarly, controller 832 has a top-down connection through connections 838 and a bottom-up connection through connection 822. The two routes for each of the controllers travel through completely independent cables, which means, if one cable fails or needs replacing, complete access is still available via the alternative path.

Passing through connection 812 and 832 in intermediate enclosures 804a-804c and 824a-824c, respectively, while providing crossover connections for HD cables 818 and 838 may be achieved in a number of ways as is illustrated in FIGS. 6 and 7. That is, for the intermediate connections, in a first implementation, the four spare PHYs are switched as pass through or terminating based on presence/absence of a second HD cable. When a second cable is present, the hardware switching mechanism routes the four spare PHYs to the downstream port. In a second implementation, a management application of controller 802 and 822 explores a topology of enclosures 804a-804n and 824a-824n, respectively, in order to discover a last enclosure in the cabling scheme. Once the last enclosure is determined, the management application sends commands to each switch of enclosures 804a-804n or 824a-824n to set the switch to the appropriate position, i.e. pass through for enclosures 804a-804c or 824a-824n. In a third implementation, rather than a switch being physically set with each enclosure, a cable connection point on the enclosure may be set by the insertion of the HD cable such that, when a second cable is present, a connection is made between the first cable and the second cable thereby routing the four spare PHYs to the downstream port. For the last enclosure of each side connected via cable 838 as well as for HD cable 818 that coupled controller 802 to controller 822, in a first implementation, each pair of the four PHYs are switched from terminating/pass through to pass through/terminating. In a second implementation, a management application of sends commands to the switch in the last enclosure of one side to terminate the first four PHYs in SAS expander and pass through the second four PHYs, and completely opposite commands to the switch of the last enclosure of the other side. Similar commands are issued to the ports of the controller, i.e. ports 816 and 836.

While the cabling scheme depicted in FIG. 8 allows controller 802 to see enclosures 804a-804n through connections 808 and alternative connection 832 as well as allowing controller 822 to see enclosures 824a-824n through connections 828 and alternative connection 812, there is no formal requirement that controller 802 can only control enclosures 804a-804n and controller 822 can only control enclosures 824a-824n. That is, controller 802 controlling enclosures on the "A" side and controller 822 controlling enclosures only on the "B" side is simply a convention due to typical cabling schemes.

Figure 9:
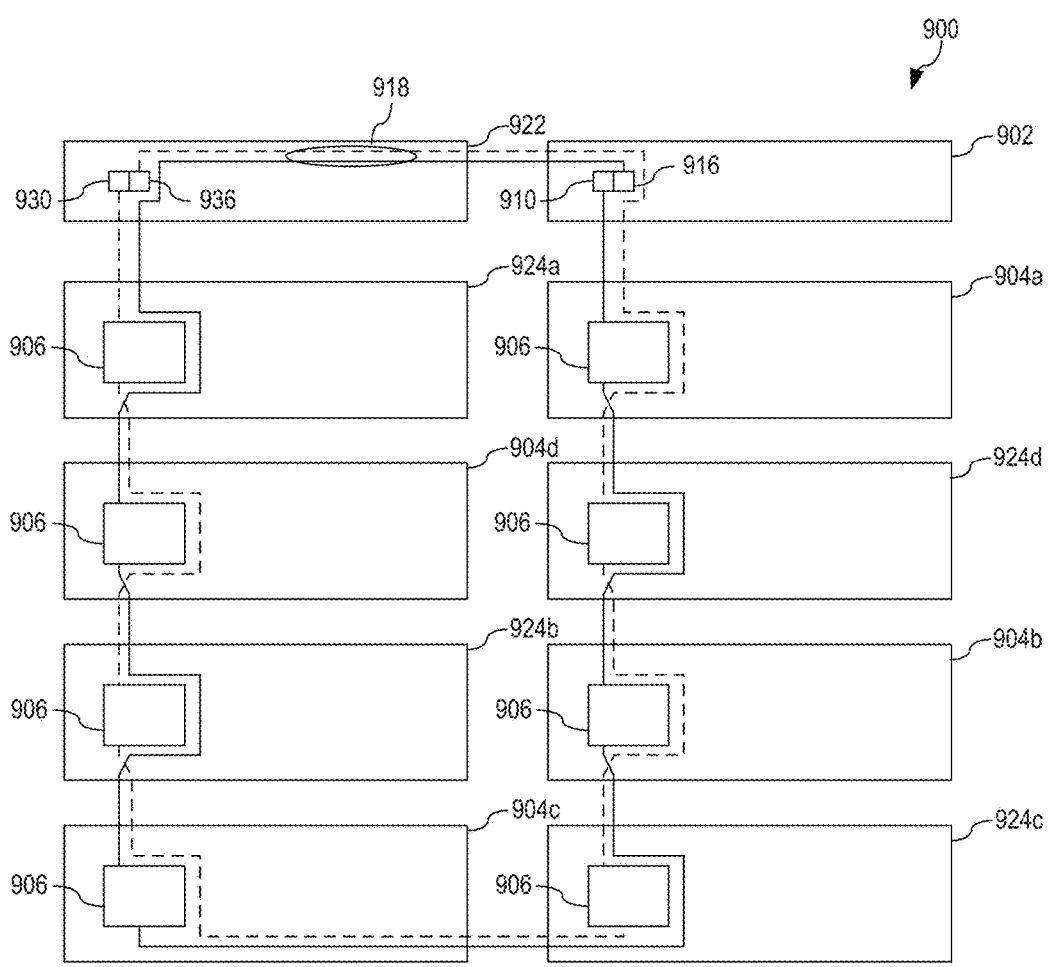
FIG. 9 depicts an example of two sets of multiple enclosures being cabled together utilizing spare PHYs of HD cables with signal redrive in accordance with an illustrative embodiment.

To provide an alternative to conventional cabling schemes and to account for instances where the distance of connection 812 and 832 through the alternative path being of a length that signal degradation may be incurred, FIG. 9 depicts an example of two sets of multiple enclosures being cabled together utilizing spare PHYs of HD cables with signal redrive in accordance with an illustrative embodiment. In data processing system 900, there is no longer a definitive "A" side and "B" side. That is, enclosures 904a-904d and 924a-924d are interlaced so that any given signal only travels a minimal of two elements before having the signal redriven by a SAS expander.

As shown in FIG. 9, controller 902 controls enclosures 904a-904d and a controller 922 controls enclosures 924a-924d. However, as is illustrated, enclosures 904a-904d and 924a-924d are not in the order shown in the previous figures. Using the configuration of HD cable 818 of FIG. 8, HD cable 918 couples controller 902 to controller 922. With regard to HD cable 918, on controller 902, the first four PHYs of HD cable 918 connect to port 916 and the second four PHYs are passed through controller 902 to controller 922. That is, the second four PHYS are passed through controller 902 to connect port 936 of controller 922. Continuing in a clockwise description, port 910 of controller 902 is coupled to enclosure 904a using a single HD cable comprising eight PHYs where the first four PHYs terminate in SAS expander 906 of enclosure 904a and the second four PHYS pass through enclosure 904a.

Enclosure 904a is cabled to enclosure 924d such that the first four PHYS pass through enclosure 924d and the second four PHYs terminate in SAS expander 906 of enclosure 924d. Enclosure 924d is cabled to enclosure 904b such that the first four PHYs terminate in SAS expander 906 of enclosure 904b and the second four PHYS pass through enclosure 904b. Enclosure 904b is cabled to enclosure 924c such that the first four PHYS pass through enclosure 924c and the second four PHYs terminate in SAS expander 906 of enclosure 924c. Enclosure 924c is cabled to enclosure 904c such that the first four PHYs terminate in SAS expander 906 of enclosure 904c and the second four PHYS pass through enclosure 904c. Enclosure 904c is now cabled to enclosure 924b such that the first four PHYS pass through enclosure 924b and the second four PHYs terminate in SAS expander 906 of enclosure 924b. Enclosure 924b is cabled to enclosure 904d such that the first four PHYs terminate in SAS expander 906 of enclosure 904d and the second four PHYS pass through enclosure 904d. Enclosure 904d is now cabled to enclosure 924a such that the first four PHYS pass through enclosure 924a and the second four PHYs terminate in SAS expander 906 of enclosure 924a. Enclosure 924a is cabled to controller 922 such that the first four PHYs pass through controller 922 and the second four PHYs terminate on port 930 of controller 922.

In this cabling scheme, if any one cable fails, an alternative route to the enclosure may be initialized. In both cases, both controllers have full access to all SAS expanders and thus, all enclosures in data processing system 900. In this example, the two routes for each of the controllers travel through completely independent cables, which means if one cable fails or needs replacing, complete access is still available via the alternative path. As with FIGS. 7 and 8, in FIG. 9, passing through/terminating the connections between controllers and enclosures may be achieved in a number of ways as is described previously with regard to FIG. 7 and/or 8. As may be seen in FIG. 9, all enclosures and hence, storage drives within the enclosures, are visible to the respective controllers. That is, there is a primary and alternative route to enclosures. The "top-down" and "bottom-up" cabling provided by both cabling schemes provides for improved bandwidth utilization. A single cable fault causes no loss of access. Enclosure power loss means only the enclosure that loses power is not accessible due to passive pass-through of the cabling connections. The simple cabling schemes and passive switching control reduces installation time and maintenance errors. Finally, less expensive SAS expanders with lower PHY counts may be utilized.

Thus, the illustrative embodiments provide; cabling methods that provide improved performance and reliability while still using the smaller SAS expander. That is, the illustrative embodiments make use of the four "wasted" PHYs, hereinafter referred to as spare PHYs, of an HD cable while utilizing the smaller SAS expander to create an alternative route that provides for cabling multiple enclosures using top-down/bottom-up cabling scheme.

As noted above, it should be appreciated that the illustrative embodiments may take the form of an entirely hardware embodiment, an entirely software embodiment or an embodiment containing both hardware and software elements. In one example embodiment, the mechanisms of the illustrative embodiments are implemented in software or program code, which includes but is not limited to firmware, resident software, microcode, etc.

A data processing system suitable for storing and/or executing program code will include at least one processor coupled directly or indirectly to memory elements through a system bus. The memory elements can include local memory employed during actual execution of the program code, bulk storage, and cache memories that provide temporary storage of at least some program code in order to reduce the number of times code must be retrieved from bulk storage during execution.

Input/output or I/O devices (including but not limited to keyboards, displays, pointing devices, etc.) can be coupled to the system either directly or through intervening I/O controllers. Network adapters may also be coupled to the system to enable the data processing system to become coupled to other data processing systems or remote printers or storage devices through intervening private or public networks. Modems, cable modems and Ethernet cards are just a few of the currently available types of network adapters.

The description of the present invention has been presented for purposes of illustration and description, and is not intended to be exhaustive or limited to the invention in the form disclosed. Many modifications and variations will be apparent to those of ordinary skill in the art without departing from the scope and spirit of the described embodiments. The embodiment was chosen and described in order to best explain the principles of the invention, the practical application, and to enable others of ordinary skill in the art to understand the invention for various embodiments with various modifications as are suited to the particular use contemplated. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method, in a data processing system, for cabling a set of enclosures, the method comprising:
    using a set of cables that comprises eight physical layers (PHYs), coupling the set of enclosures together such that:
        for a first enclosure and each intermediate enclosure in the set of enclosures, terminating at least four PHYs of the eight PHYs within a Serial Attached Small Computer System Interface (SCSI) (SAS) expander of the first enclosure and a SAS expander of each intermediate enclosure while passing through a remaining PHYs of the eight PHYs without connecting to the SAS expander of the first enclosure and the SAS expander of each intermediate enclosure; and
        for a last enclosure in the set of enclosures, terminating all of the eight PHYs in the SAS expander of the last enclosure.

2. The method of claim 1, wherein the at least four PHYS is a first set of four PHYs of the eight PHYs, wherein the remaining PHYs is a second set of four PHYs of the eight PHYs, wherein, for the first enclosure and each intermediate enclosure in the set of enclosures, the first set of four PHYs of the eight PHYs terminate within the SAS expander of the first enclosure and the SAS expander of each intermediate enclosure and the second set of four PHYs of the eight PHYs pass through the first enclosure and each intermediate enclosure, and wherein, for the last enclosure in the set of enclosures, both the first set of four PHYs of the eight PHYs and the second set of four PHYs of the eight PHYs terminate in the SAS expander of the last enclosure.

3. The method of claim 2, wherein the first enclosure and each intermediate enclosure in the set of enclosures pass through the second set of four PHYs based on a presence of a first and second cable that causes a switching mechanism to route the second set of four PHYs to a downstream port.

4. The method of claim 2, wherein the first enclosure and each intermediate enclosure in the set of enclosures pass through the second set of four PHYs based on a management application identifying the first enclosure and each intermediate enclosure as not being the last enclosure and sending a command to a switching mechanism in the first enclosure and each intermediate enclosure to pass through the second set of four PHYs to a downstream port.

5. The method of claim 2, wherein the first enclosure and each intermediate enclosure in the set of enclosures pass through the second set of four PHYs based on a presence of a first and second cable that causes a physical cable-connection point on the enclosure to route the second set of four PHYs to a downstream port.

6. The method of claim 1, wherein:
    the at least four PHYS is a first set of four PHYs of the eight PHYs,
    the remaining PHYs is a second set of four PHYs of the eight PHYs,
    for the first enclosure and each other non-consecutive intermediate enclosure in the set of enclosures, the first set of four PHYs of the eight PHYs terminate within the Serial Attached Small Computer System Interface (SCSI) (SAS) expander of the first enclosure and the SAS expander of each other non-consecutive intermediate enclosure and the second set of four PHYs of the eight PHYs pass through the SAS expander of the first enclosure and the SAS expander of each other non-consecutive intermediate enclosure without connecting to the SAS expander of the first enclosure and the SAS expander of each other non-consecutive intermediate enclosure,
    for remaining intermediate enclosures in the set of enclosures, the first set of four PHYs of the eight PHYs pass through the remaining intermediate enclosures without connecting to the SAS expander of the remaining intermediate enclosures and the second set of four PHYs terminate within the SAS expander of the remaining intermediate enclosures, and
    for the last enclosure in the set of enclosures, both the first set of four PHYs of the eight PHYs and the second set of four PHYs of the eight PHYs terminate in the SAS expander of the last enclosure.

7. The method of claim 6, wherein the first enclosure and each other non-consecutive intermediate enclosure in the set of enclosures pass through the second set of four PHYs based on a presence of a first and second cable that causes a switching mechanism to route the second set of four PHYs to a downstream port and wherein the all remaining intermediate enclosures in the set of enclosures pass through the first set of four PHYs based on a presence of a first and second cable that causes a switching mechanism to route the first set of four PHYs to a downstream port.

8. The method of claim 6, wherein the first enclosure and each other non-consecutive intermediate enclosure in the set of enclosures pass through the second set of four PHYs based on a management application identifying the first enclosure and each other non-consecutive intermediate enclosure as not being the last enclosure and sending a command to a switching mechanism in the first enclosure and each other non-consecutive intermediate enclosure to pass through the second set of four PHYs to a downstream port and wherein the remaining intermediate enclosures in the set of enclosures pass through the first set of four PHYs based on the management application identifying the remaining intermediate enclosure as not being the last enclosure and sending a command to a switching mechanism in the remaining intermediate enclosures to pass through the first set of four PHYs to a downstream port.

9. The method of claim 6, wherein the first enclosure and each other non-consecutive intermediate enclosure in the set of enclosures pass through the second set of four PHYs based on a presence of a first and second cable that causes a physical cable-connection point on the enclosure to route the second set of four PHYs to a downstream port and wherein the remaining intermediate enclosures in the set of enclosures pass through the first set of four PHYs based on a presence of a first and second cable that causes a physical cable-connection point on the enclosure to route the first set of four PHYs to a downstream port.

* * * * *